US012762312B2

(12) United States Patent
Hermetet et al.

(10) Patent No.: US 12,762,312 B2
(45) Date of Patent: Oct. 13, 2026

(54) METHOD AND APPARATUS FOR AUTOMATIC UNDERHOOD THERMAL MODELING

(71) Applicant: Dassault Systemes Americas Corp., Waltham, MA (US)

(72) Inventors: Andrew Hermetet, Livonia, MI (US); Mark Malinovskiy, Livonia, MI (US); Edward Dean Tate, Jr., Grand Blanc, MI (US)

(73) Assignee: Dassault Systemes Americas Corp., Waltham, MA (US)

(*) Notice: Subject to any disclaimer, the term of this patent is extended or adjusted under 35 U.S.C. 154(b) by 279 days.

(21) Appl. No.: 17/011,088

(22) Filed: Sep. 3, 2020

(65) Prior Publication Data

US 2021/0117597 A1 Apr. 22, 2021

Related U.S. Application Data

(60) Provisional application No. 62/915,686, filed on Oct. 16, 2019.

(51) Int. Cl.
*G06F 30/28* (2020.01)
*G06T 17/20* (2006.01)

(52) U.S. Cl.
CPC .............. *G06F 30/28* (2020.01); *G06T 17/20* (2013.01)

(58) Field of Classification Search
CPC .. G06F 30/28; G06F 2111/10; G06F 2113/28; G06F 2119/08; G06T 17/20
USPC .............................................................. 703/9
See application file for complete search history.

(56) References Cited

U.S. PATENT DOCUMENTS

| | | | | |
|---|---|---|---|---|
| 3,069,654 | A | 12/1962 | Hough | |
| 5,910,902 | A | 6/1999 | Molvig et al. | |
| 6,209,794 | B1 * | 4/2001 | Webster | G06F 30/15 236/94 |
| 6,748,349 | B1 | 6/2004 | Majumdar et al. | |
| 7,558,714 | B2 | 7/2009 | Shan et al. | |
| 7,698,095 | B2 | 4/2010 | Chung et al. | |

(Continued)

FOREIGN PATENT DOCUMENTS

| | | |
|---|---|---|
| CN | 102260520 A | 11/2011 |
| CN | 102473029 A | 5/2012 |

(Continued)

OTHER PUBLICATIONS

Takiguchi, Takashi, et al. "Full Vehicle Thermal Prediction by Identification Approach from Test Results." (SAE, 2015) SAE International Journal of Materials and Manufacturing 8, No. 2: 289-299. http://dx.doi.org/10.4271/2015-01-0441 (Year: 2015).*

(Continued)

*Primary Examiner* — Brian S Cook
(74) *Attorney, Agent, or Firm* — Fish & Richardson P.C.

(57) ABSTRACT

Computer-implemented techniques for simulating underhood conditions for a vehicle and the like are disclosed. The computer-implemented techniques include receiving by a computer processing system digital data of a three dimensional representation of modeling of a fluid source, a fluid sink, and plural fluid nodes, executing a transient thermal model that includes an underhood fluid model, and performing a simulation to simulate fluid flow from the fluid source to the fluid sink through each of the plural fluid nodes.

21 Claims, 11 Drawing Sheets

(56) References Cited

U.S. PATENT DOCUMENTS

| | | | | |
|---|---|---|---|---|
| 9,490,682 | B2 * | 11/2016 | Borisenko | H02P 29/02 |
| 9,576,087 | B2 | 2/2017 | Chen et al. | |
| 2014/0136159 | A1 | 5/2014 | Chen et al. | |
| 2018/0018413 | A1 * | 1/2018 | Kaushik | G06F 30/20 |
| 2020/0226302 | A1 * | 7/2020 | James | G06F 30/15 |
| 2020/0265178 | A1 * | 8/2020 | Hodes | F28F 13/06 |

FOREIGN PATENT DOCUMENTS

| | | | |
|---|---|---|---|
| CN | 109074349 | A | 12/2018 |
| CN | 110175342 | A | 8/2019 |
| DE | 102015217177 | A1 | 3/2017 |
| JP | 2004-213297 | A | 7/2004 |
| JP | 2016-146031 | A | 8/2016 |
| WO | WO 2008034499 | | 3/2008 |

OTHER PUBLICATIONS

Svantesson, Einar. "Transient thermal management simulations of complete heavy-duty vehicles." (KTH School of Engineering Sciences, Jun. 2019) Master in Engineering Mechanics, Thesis. KTH School of Engineering Sciences. (Year: 2019).*

Bayraktar, Ilhan. "Time dependent simulation methods for vehicle thermal management." (GVSETS, 2009) In Proceedings of the 2009 Ground Vehicle Systems Engineering and Technology Symposium, pp. 1-4. (Year: 2009).*

Kaushik, S., "Thermal Management of a Vehicle's Underhood and Underbody Using Appropriate Math-Based Analytical Tools and Methodologies," (SAE, 2007) SAE Technical Paper 2007-01-1395, 2007, https://doi.org/10.4271/2007-01-1395. (Year: 2007).*

Leon Moya, Begoña. "Fluid and Thermodynamic Underhood Simulations." (2013, Lund University Publicatiosn) ISRN LUTMDN/TMHP—13/5268—SE <https://lup.lub.lu.se/luur/download?func=downloadFile&recordOld=3563891&fileOld=3563896> (Year: 2013).*

Wang, Guohua, Qing Gao, Tianshi Zhang, and Yan Wang. "A simulation approach of under-hood thermal management." Advances in Engineering Software 100 (2016): 43-52. (Year: 2016).*

Kumar, Vivek, Sangeet Kapoor, Gyan Arora, Sandip K. Saha, and Pradip Dutta. A combined CFD and flow network modeling approach for vehicle underhood air flow and thermal analysis. No. 2009-01-1150. SAE Technical Paper, 2009. (Year: 2009).*

Minovski, Blago et al. "A numerical investigation of thermal engine encapsulation concept for a passenger vehicle and its effect on fuel consumption." Proceedings of the Institution of Mechanical Engineers, Part D: Journal of Automobile Engineering 233, No. 3 ( 2019): 557-571. (Year: 2019).*

Pang, S. C., H. H. Masjuki, M. A. Hazrat, and M. A. Kalam. "Integration of 1d and 3d simulations of engine cooling system: After keyed-off." In 2011 10th International Symposium on Distributed Computing and Applications to Business, Engineering and Science , pp. 46-50. IEEE, 2011. (Year: 2011).*

Piccione, Rocco, Antonio Vulcano, and Sergio Bova. "A Convective Mass Transfer Model for Predicting Vapor Formation Within the Cooling System of an Internal Combustion Engine After Shutdown." (ASME, 2010). Journal of engineering for gas turbines and power vol. 132, No. 2, 022804. (Year: 2010).*

"Forced Convection—External Flows" by Suryanarayana from Kreith, F.; Boehm, R.F.; et al. "Heat and Mass Transfer" Mechanical Engineering Handbook Ed. Frank Kreith Boca Raton: CRC Press LLC, 1999—definition of forced convection and free/ natural convection, [p. 4-25 paragraph 3] (Year: 1999).*

Franchetta, Matteo, Thomas G. Bancroft, and K. O. Suen. "Fast transient simulation of vehicle underhood in heat soak." SAE Transactions (2006): 1526-1538. (Year: 2006).*

Yuan, Ruoyang, Sureshkumar Sivasankaran, Nilabza Dutta, Wilko Jansen, and Kambiz Ebrahimi. "Numerical investigation of buoyancy-driven heat transfer within engine bay environment during thermal soak." Applied Thermal Engineering 164 (2020): 114525. (Year: 2019).*

Bohac, Stanislav V., Douglas M. Baker, and Dennis N. Assanis. "A global model for steady state and transient SI engine heat transfer studies." SAE transactions (1996): 196-214. (Year: 1996).*

Minovski, Blago. Engine Encapsulation for Increased Fuel Efficiency of Road Vehicles. (Chalmers University of Technology, 2017). Doctoral Thesis. Goteborg, Sweden. (Year: 2017).*

Minovski, Blago. Coupled simulations of cooling and engine systems for unsteady analysis of the benefits of thermal engine encapsulation. Thesis. (Chalmers University of Technology, 2015). Goteborg, Sweden. (Year: 2015).*

Vdovin, Alexey. "Cooling performance simulations in GT-Suite." Master's thesis, (Chalmers University of Technology, 2010). Master's Thesis. Goteborg, Sweden. (Year: 2010).*

GT-SUITE Flow Theory Manual Version 2016. Gamma Technologies. 2015. (Year: 2015).*

Minovski, Blago. "Study of Software System Integration for Transient Simulation of Future Cooling System for Heavy Truck Applications." (Chalmers University of Technology, 2013). Master's Thesis. Goteborg, Sweden. (Year: 2013).*

Kiss_2018 (Effects of Transient Heat Transfer on Compressor Stability, Journal of Turbomachinery, Dec. 2018, vol. 140) (Year: 2018).*

Adiabatic_Process_2019 (Adiabatic process Wikipedia archives dated Sep. 12, 2019) (Year: 2019).*

Otto_Cycle_2019 (Applications of the First Law of Heat Engines, Wayback machine archive dated Jun. 23, 2019) (Year: 2019).*

Wagner_2001 (Thermal Modeling of Engine Components for Temperature Prediction and Fluid Flow Regulation, Mar. 2001 SAE Technical Papers). (Year: 2001).*

Dassault Systèmes, "PowerTherm", Jan. 1, 2018, retrieved on Mar. 10, 2021, retrieved from URL<"https://www.3ds.com/fileadmin/PRODUCTS-SERVICES/SIMULIA/PRODUCTS/POWERFLOW/PDF/PowerTHERM/powertherm-product-brief-2018-3ds.pdf">, 3 pages.

Dembele, "Object Detection Using Circular Hough Transform", ECE—Design Team 3 Documentation, Dec. 2015, 12 pages.

Duda et al., "Use of the Hough Transformation to Detect Lines and Curves in Picture", Commun. ACM, Apr. 1972, 15(1):11-15, 18 pages.

Extended European Search Report in Patent Application No. 20201499.9, dated Feb. 23, 2021, 11 pages.

Hassanein et al., "A Survey on Hough Transform, Theory, Techniques and Applications," IJCSI, Jan. 2015, 18 pages.

Juszkiewicz et al., "Approximating Convective Boundary Conditions for Transient Thermal Simulations with Surrogate Models for Thermal Packaging Studies", Konferenzbetrag "IBEC 2003" UND SAE Technical Paper Series Jan. 20, 2002 48, Apr. 2019, 17 pages.

Kaushik, "Thermal Management of a Vehicle's Underhood and Underbody Using Appropriate Math-Based Analytical Tools and Methodologies", Konferenzbetrag "IBEC 2003" UND SAE Technical Paper Series Jan. 20, 2002 48, Apr. 2007, 12 pages.

Response Surfaces: Designs and Analyses, 2nd edition, Revised and Expanded, 1996, 527 pages.

Office Action in Japanese Appln. No. 2020-174105, mailed on Dec. 17, 2024, 5 pages (with English Translation).

Office Action in Japanese Appln. No. 2020-174105, mailed on Jun. 24, 2024, 9 pages (with Machine Translation).

Office Action in Chinese Appln. No. 202011106204.5, mailed on Dec. 2, 2024, 11 pages (with English translation).

Office Action in Chinese Appln. No. 202011106204.5, mailed on Sep. 25, 2025, 14 pages (with English translation).

* cited by examiner

METHOD AND APPARATUS FOR AUTOMATIC UNDERHOOD THERMAL MODELING

CLAIM OF PRIORITY

This application claims priority under 35 USC § 119(e) to U.S. Provisional Patent Application Ser. No. 62/915,686, filed on Oct. 16, 2019, and entitled "METHOD AND APPARATUS FOR AUTOMATIC UNDERHOOD THERMAL MODELING," the entire contents of which are hereby incorporated by reference.

BACKGROUND

This description relates to computer simulation of physical processes, such as thermal modeling of physical fluid flows.

High Reynolds number flow has been simulated by generating discretized solutions of the Navier-Stokes differential equations by performing high-precision floating point arithmetic operations at each of many discrete spatial locations on variables representing the macroscopic physical quantities (e.g., density, temperature, flow velocity). Another approach replaces the differential equations with what is generally known as lattice gas (or cellular) automata, in which the macroscopic-level simulation provided by solving the Navier-Stokes equations is replaced by a microscopic-level model that performs operations on particles moving between sites on a lattice.

Some fluid simulations involve simulating thermal conditions under the hood of a vehicle. Conventional techniques for simulating under the hood thermal conditions involve either executing a coupled Computational Fluid Dynamic model and thermal model at one operating point or executing a coupled Computational Fluid Dynamic model and thermal models at several operating points but without incorporation of both response surface models and under the hood (hereinafter "underhood") fluid nodes.

SUMMARY

Set out below is an approach that includes an integration of a response surface model and a transient thermal model with an underhood fluid model implemented inside the transient thermal model useful for a thermal simulation.

When applying the underhood fluid model to a relevant problem, several assumptions are made such as underhood components "Near Wall Temperature" trends with the upstream air temperatures, underhood air temperatures do not deviate significantly from upstream air temperatures, post cooling, underhood air flow is well-mixed or clearly segmented, air temperatures under the hood are relatively uniform or clearly divided by region, radiation/conduction incident heat rate dominates over convection for underhood components, heat transfer to underhood components is dominated by radiation/conduction from other high temperature components and underhood airflow rate is non-zero. As a result a lumped thermal capacity is used in calculations which assumes non-zero air flow rate for an entirety of a drive cycle. A lumped thermal capacity may have, a heat transfer coefficient (HTC) assigned.

According to an aspect, a computer-implemented method includes receiving by a computer processing system digital data of a three dimensional representation of modeling of a fluid source and a fluid sink, and plural fluid nodes, executing a transient thermal model that includes an underhood fluid model of the plural fluid nodes, and performing a simulation to simulate fluid flow from the fluid source to the fluid sink through each of the plural fluid nodes.

The following are some of the features among other features as disclosed herein, within the scope of the above aspect.

The underhood fluid model includes plural nodes that are an upstream air node, a cooling package node, and one or more underhood fluid nodes. The method further includes executing response surface models to provide predictions of air temperature upstream and downstream of the cooling package, and air mass flow rate passing through the cooling package, calculating cooling package heat rejection from the predictions.

Performing a simulation to simulate fluid flow includes calculating heat rejection and transferring heat rejection by the cooling package to a underhood fluid node.

When the vehicle powertrain is modelled in an off state, the cooling package convects heat to the underhood node using a lumped thermal capacity that is initialized with a pre-calculated value. The air temperature and air mass flow rate determine air temperature and mass flow rate coming from the fluid source into the upstream air node. The components have temperatures calculated through the simulation are initialized to a certain heat transfer coefficient (HTC) and near wall temperature (NWT), with the near wall temperature for the components in the underhood set to the underhood fluid node temperature.

The vehicle powertrain is modelled in either an on state or in an off state. When plural cycles of the vehicle powertrain being in an off state is used in the method, the method further includes applying plural thermal lumped capacities of different initialization temperatures.

According to an additional aspect, a computer system includes one or more processors, and memory storing a computer program that includes computer instructions that when executed by the one or more processors causes the one or more processors to receive digital data of a three dimensional representation of modeling of a fluid source and a fluid sink, and plural fluid nodes, execute a transient thermal model that includes an underhood fluid model of the plural fluid nodes, and perform a simulation to simulate fluid flow from the fluid source to the fluid sink through each of the plural fluid nodes.

The following are some of the features among other features as disclosed herein, within the scope of the above aspect.

The underhood fluid model includes plural nodes that are an upstream air node, a cooling package node, and one or more underhood fluid nodes. The system further includes instructions to cause the one or more processors to execute response surface models to provide predictions of air temperature upstream and downstream of the cooling package, and air mass flow rate passing through the cooling package, calculate cooling package heat rejection from the predictions.

Performing a simulation to simulate fluid flow comprises instructions to cause the one or more processors to calculate heat rejection and transfer heat rejection by the cooling package to a underhood fluid node. When the vehicle powertrain is modelled in an off state, the cooling package convect heat to the underhood node using a lumped thermal capacity that is initialized with a pre-calculated value. The air temperature and air mass flow rate determine air temperature and mass flow rate coming from the fluid source into the upstream air node. The components have temperatures calculated through the simulation are initialized to a certain heat transfer coefficient (HTC) and near wall temperature (NWT), with the near wall temperature for the components set to the underhood fluid node temperature.

The vehicle powertrain is modelled in either an on state or in an off state. When plural cycles of the vehicle powertrain being in an off state is used in the method, the method further includes applying plural thermal lumped capacities of different initialization temperatures.

According to an additional aspect, a computer program product stored on an non-transitory computer readable medium including computer instructions for causing a system comprising one or more processors and memory to receive digital data of a three dimensional representation of modeling of a fluid source and a fluid sink, and plural fluid nodes, execute a transient thermal model that includes an underhood fluid model of the plural fluid nodes, and perform a simulation to simulate fluid flow from the fluid source to the fluid sink through each of the plural fluid nodes.

The following are some of the features among other features as disclosed herein, within the scope of the above aspect.

The computer program product further includes instructions to cause the one or more processors to execute response surface models to provide predictions of air temperature upstream and downstream of the cooling package, and air mass flow rate passing through the cooling package, calculate cooling package heat rejection from the predictions.

One or more of the above aspects may include one or more of the following features.

The aspects permit simulation of vehicle temperature development over a long-term drive cycle test. During a vehicle development process, drive cycle test data is one of the most informative types of data from a thermal standpoint for overall vehicle performance. However, running an actual drive cycle test requires building of a prototype, which can be costly and involves a significant amount of time, which can delay introduction of new designs. The underhood fluid model methodology disclosed below provides an accurate methodology for simulating vehicle thermal performance through a long-term drive cycle test. This underhood fluid model methodology can enable engineers to commence drive cycle testing before prototyping and integrate the drive cycle testing into larger studies such as multi-disciplinary optimizations.

DETAILED DESCRIPTION

In a LBM-based physical process simulation system, fluid flow is represented by the distribution function values $f_i$, evaluated at a set of discrete velocities $c_i$. The dynamics of the distribution function are governed by the equation below, where $f_i(0)$ is known as the equilibrium distribution function, defined as:

$$f_\alpha^{(0)} = w_{\alpha\rho}\left[1 + u_\alpha + \frac{u_\alpha^2 - u^2}{2} + \frac{u_\alpha(u_\alpha^2 - 3u^2)}{6}\right] \quad \text{Eq.(I-1)}$$

This equation is the well-known lattice Boltzmann equation that describe the time-evolution of the distribution function, $f_i$. The left-hand side represents the change of the distribution due to the so-called "streaming process." The streaming process is when a pocket of fluid starts out at a grid location, and then moves along one of the velocity vectors to the next grid location. At that point, the "collision factor," i.e., the effect of nearby pockets of fluid on the starting pocket of fluid, is calculated. The fluid can only move to another grid location, so the proper choice of the velocity vectors is necessary so that all the components of all velocities are multiples of a common speed.

The right-hand side of the first equation is the aforementioned "collision operator" which represents the change of the distribution function due to the collisions among the pockets of fluids. The particular form of the collision operator used here is Bhatnagar, Gross and Krook (BGK) compliant. It forces the distribution function to go to the prescribed values given by the second equation, which is the "equilibrium" form.

The BGK operator is constructed according to the physical argument that, no matter what the details of the collisions, the distribution function approaches a well-defined local equilibrium given by $\{f^{eq}(x, v_2, t)\}$ via collisions:

$$C = -\frac{1}{\tau}(f - f^{eq}) \quad \text{Eq.(I-2)}$$

where the parameter $\tau$ represents a characteristic relaxation time to equilibrium via collisions. Dealing with particles the relaxation time is typically taken as a constant.

From this simulation, conventional fluid variables, such as mass $\rho$ and fluid velocity u, are obtained as simple summations. An LBM model can be implemented efficiently on scalable computer platforms and run with great robustness for time unsteady flows and complex boundary conditions.

A standard technique of obtaining the macroscopic equation of motion for a fluid system from the Boltzmann equation is the Chapman-Enskog method in which successive approximations of the full Boltzmann equation are taken.

In a fluid system, a small disturbance of the density travels at the speed of sound. In a gas system, the speed of the sound is generally determined by the temperature. The importance of the effect of compressibility in a flow is measured by the ratio of the characteristic velocity and the sound speed, which is known as the Mach number.

Figure 1:
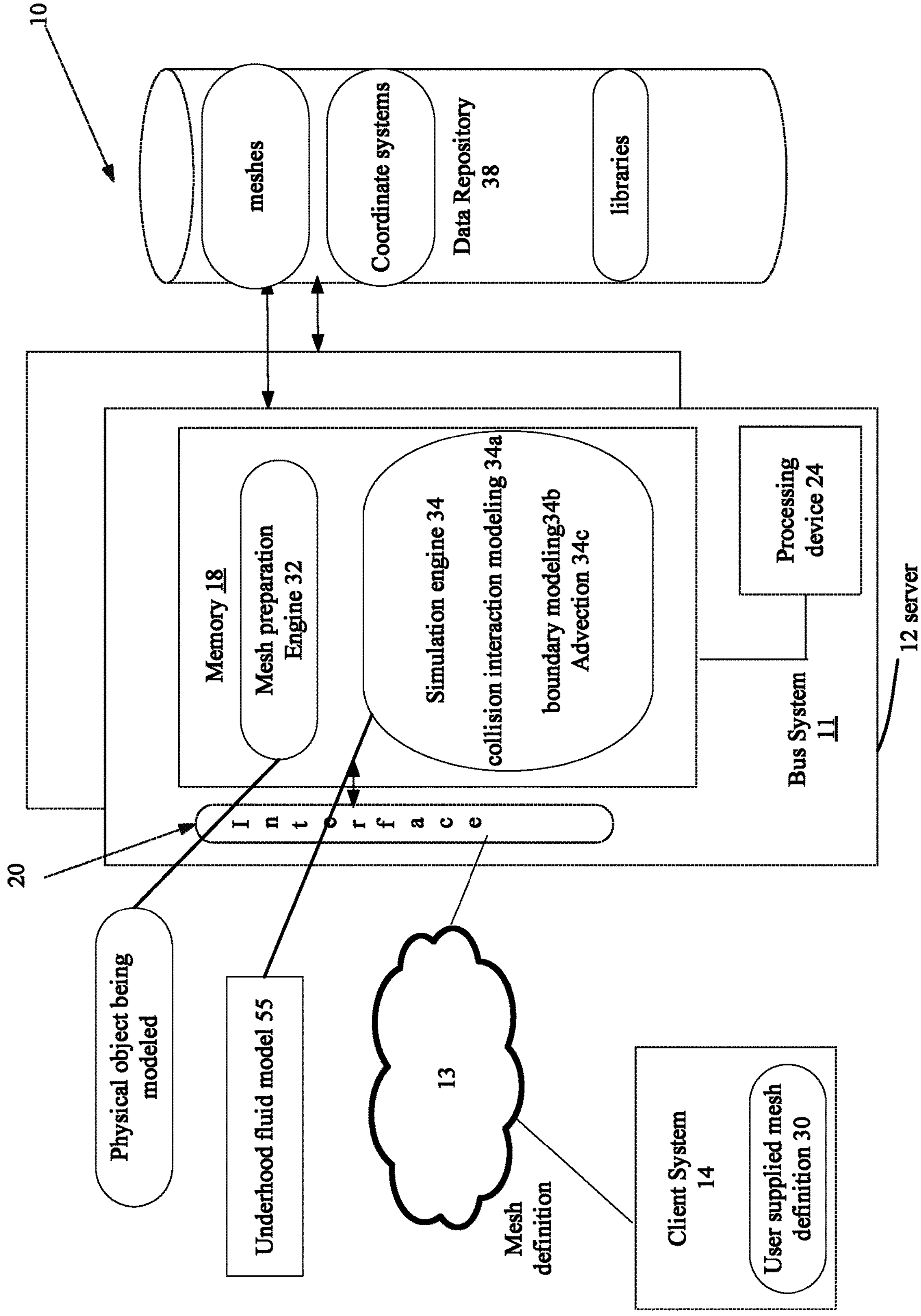
FIG. 1 depicts a system for simulation of fluid flows, which includes a process for determining underhood conditions over a drive cycle test, with the simulation example using a turbulent boundary layer model for compressible flows.

Referring now to FIG. 1, a system 10 that includes a underhood fluid model 55 is described. The underhood model 55 is an automated process for determining underhood conditions. A thorough discussion of the underhood model 55 is set out in FIGS. 12-15.

The system 10 in this implementation is based on a client-server or cloud based architecture and includes a server system 12 implemented as a massively parallel computing system 12 (stand alone or cloud-based) and a client system 14 coupled via network 13. The server system 12 includes memory 18, a bus system 11, interfaces 20 (e.g., user interfaces/network interfaces/display or monitor interfaces, etc.) and a processing device 24. In memory 18 are a mesh preparation engine 32 and a simulation engine 34.

While FIG. 1 shows the mesh preparation engine 32 in memory 18, the mesh preparation engine can be a third party application that is executed on a different system than server 12. Whether the mesh preparation engine 32 executes in memory 18 or is executed on a different system than server 12, the mesh preparation engine 32 receives a user-suppled mesh definition 30 and the mesh preparation engine 32 prepares a mesh and sends (and or stores) the prepared mesh to the simulation engine 34 according to a physical object that is being modelled for simulation by the simulation engine 34. The simulation engine 34 includes collision interaction module 34*a*, boundary module 34*b* and advection particle collision interaction module 34*c*. The system 10 accesses a data repository 38 that stores 2D and/or 3D meshes (Cartesian and/or curvilinear), coordinate systems, and libraries.

Figure 2:
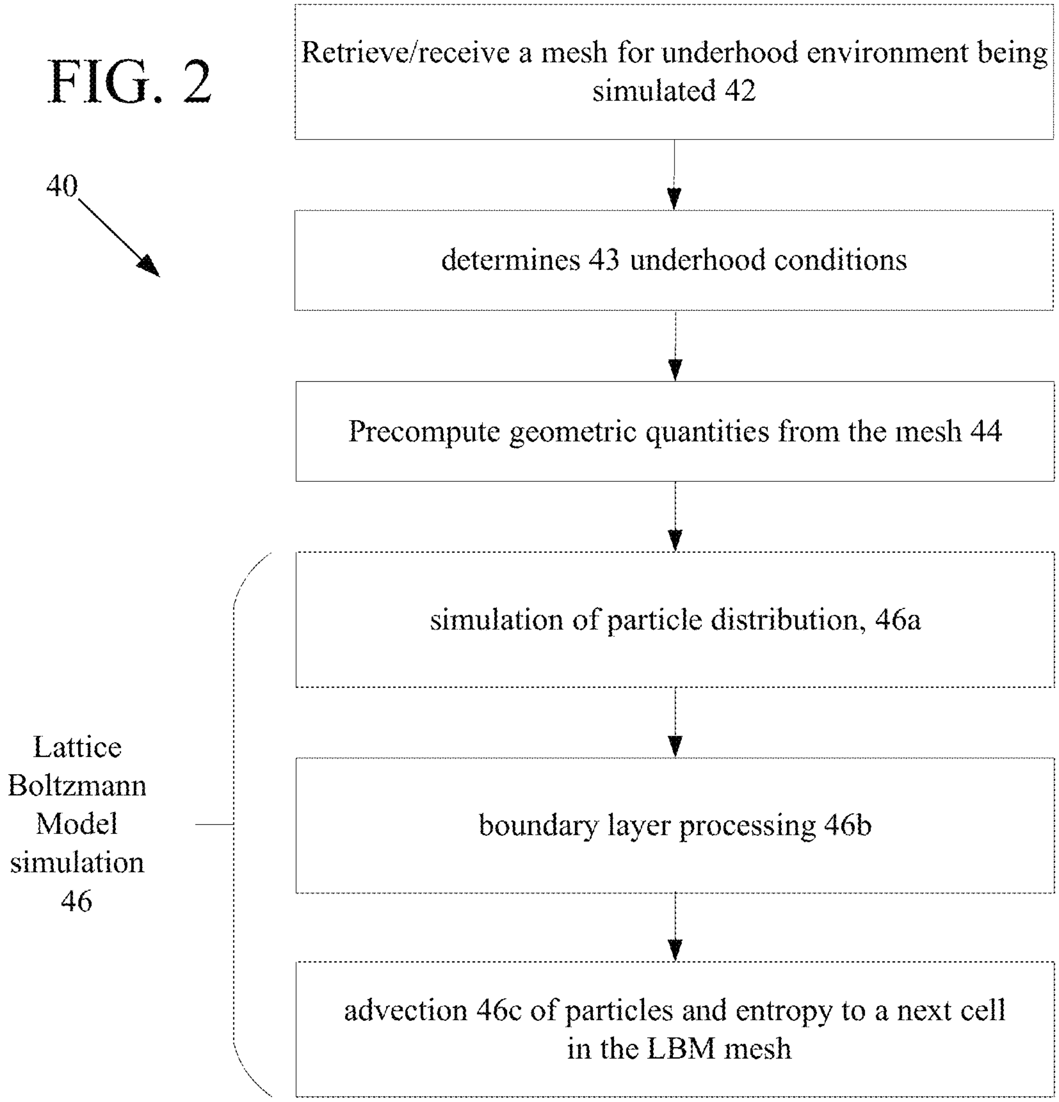
FIG. 2 depicts a flow chart showing operations for formulation of a Lattice Boltzmann Model simulation with the determined underhood conditions and the turbulent boundary layer model.

Referring now to FIG. 2, a process 40 for simulating fluid flow about a representation of a physical object is shown. In the example that will be discussed herein, the physical object a collection of components that are present under a vehicle hood. The use of components under a vehicle hood is merely illustrative however, as the physical objects can be of any shape or function that expels heat during operation.

The process 40 receives 42, e.g., from client system 14 or retrieves from the data repository 38, a mesh (or grid) for the physical object being simulated, the underhood system. In other embodiments, either an external system or the server 12 based on user input, generates the mesh for the physical object being simulated.

The process 40 also determines 43 underhood conditions by either invoking the automated process 55 for determining underhood conditions or being supplied the calculated underhood conditions from another system/process that executed the automated process 55. That is, in some embodiments, either an external system or the server 12 executes the automated process 55 for determining underhood conditions and provides those determined underhood conditions as input to the simulation process 40.

The process precomputes 44 geometric quantities from the retrieved mesh and performs dynamic Lattice Boltzmann Model simulation 46 using the precomputed geometric quantities corresponding to the retrieved mesh. Lattice Boltzmann Model simulation includes the simulation 46*a* of evolution of particle distribution, performs boundary layer processing 46*b* when the flow impacts a physical surface, and performs advection 46*c* of particles to a next cell in the LBM mesh.

Figure 3:
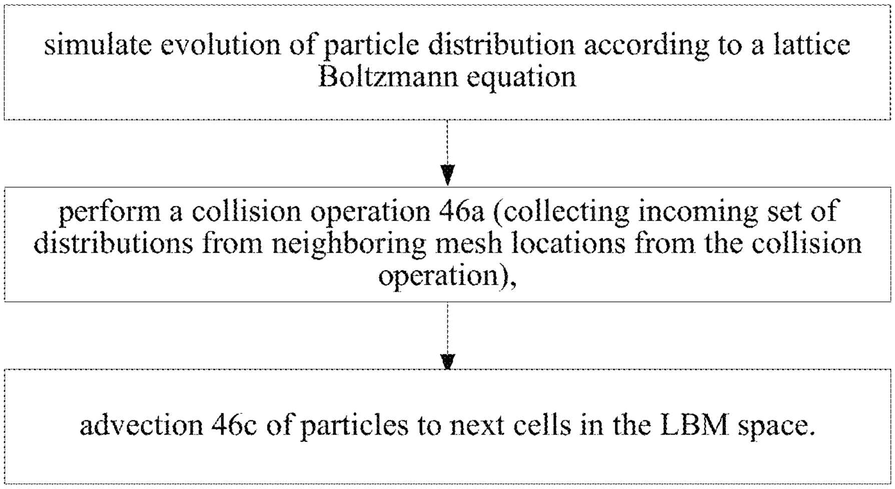
FIG. 3 depicts a flow chart showing simulation operations using the Lattice Boltzmann model.

Referring now to FIG. 3, the simulation process 46 simulates evolution of particle distribution according to a lattice Boltzmann equation (LBE). The process 46 (see FIG. 2) performs a collision operation 46*a* (and collecting an incoming set of distributions from neighboring mesh locations from the collision operation), evaluates 46*b* flows at physical boundaries according to boundary modeling, and an advection 46*c* of particles to next cells in the LBM space.

An automated process for a fluid flow simulation performed by the simulation engine 34 is described in U.S. patent application Ser. No. 11/463,673, entitled COMPUTER SIMULATION OF PHYSICAL PROCESS (now issued as U.S. Pat. No. 7,558,714) incorporated herein in its entirety by reference.

In FIGS. 4, 5 and 7-11, each of these figures are labeled as prior art because these figures appear in the above referenced patent. However, those figures as they appear in the above patent do not take into consideration any modifications that would be made to a flow simulation using the underhood process, because that underhood process, as described herein, is not described in the above referenced patent.

Figure 4:
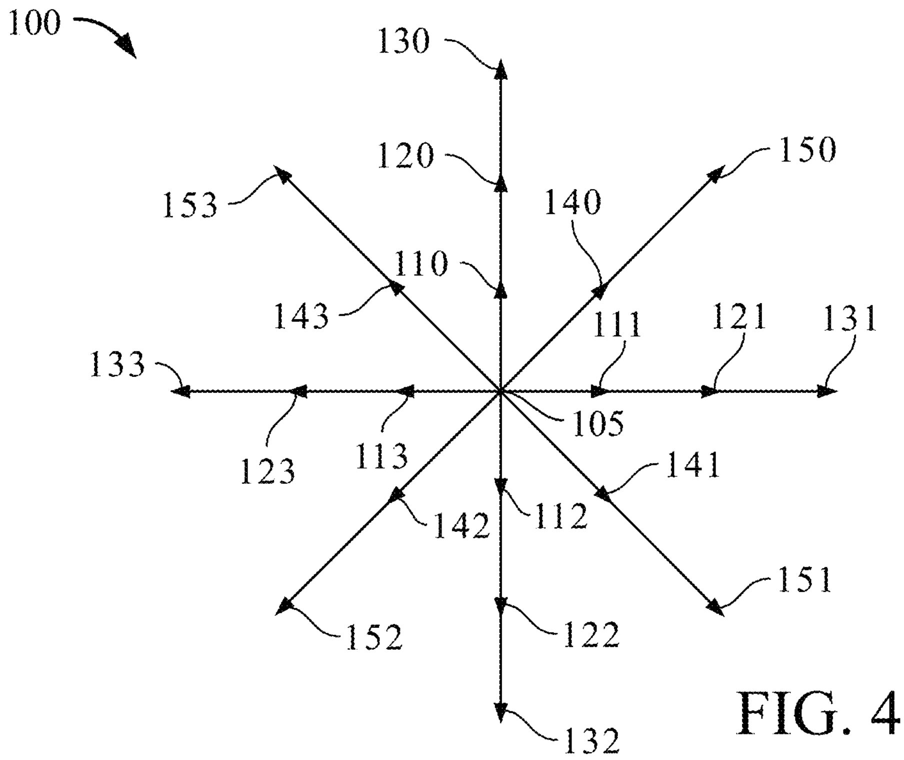
prior art FIG. 4
FIGS. 4 and 5 illustrate velocity components of two LBM models (prior art).

Referring to FIG. 4, a first model (2D-1) 100 is a two-dimensional model that includes 21 velocities. Of these 21 velocities, one (105) represents particles that are not moving; three sets of four velocities represent particles that are moving at either a normalized speed (r) (110-113), twice the normalized speed (2r) (120-123), or three times the normalized speed (3r) (130-133) in either the positive or negative direction along either the x or y axis of the lattice; and two sets of four velocities represent particles that are moving at the normalized speed (r) (140-143) or twice the normalized speed (2r) (150-153) relative to both of the x and y lattice axes.

Figure 5:
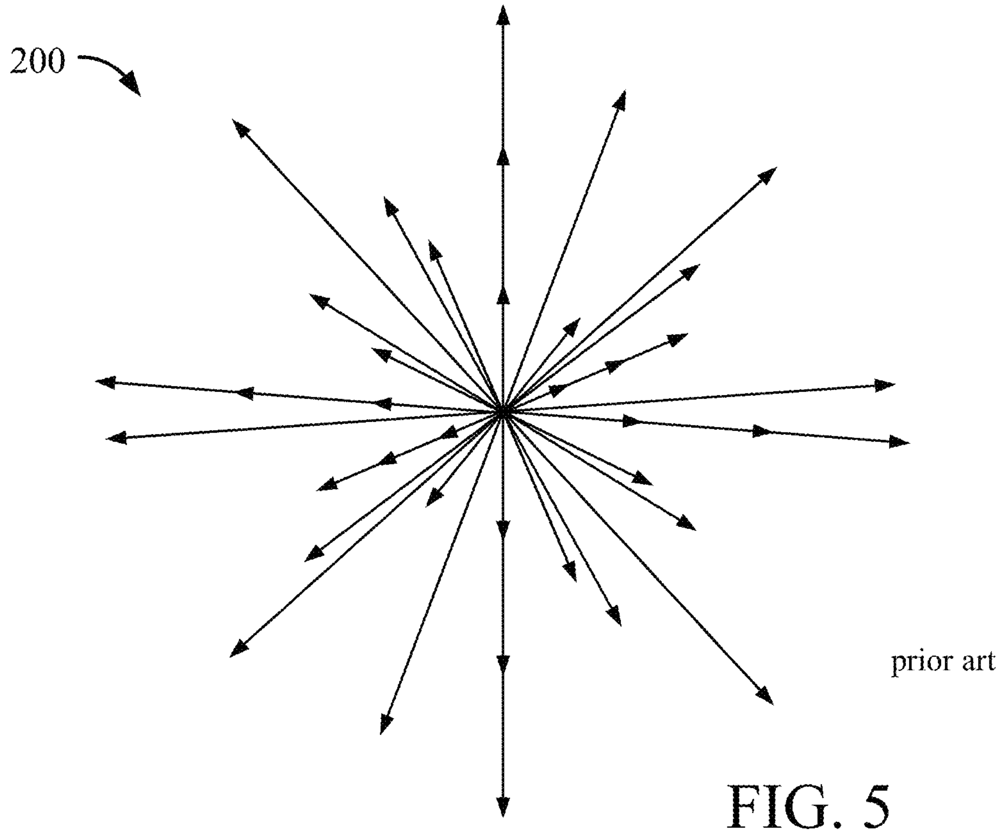
prior art FIG. 5

As also illustrated in FIG. 5, a second model (3D-1) 200 is a three-dimensional model that includes 39 velocities, where each velocity is represented by one of the arrowheads of FIG. 8. Of these 39 velocities, one represents particles that are not moving; three sets of six velocities represent particles that are moving at either a normalized speed (r), twice the normalized speed (2r), or three times the normalized speed (3r) in either the positive or negative direction along the x, y or z axis of the lattice; eight represent particles that are moving at the normalized speed (r) relative to all three of the x, y, z lattice axes; and twelve represent particles that are moving at twice the normalized speed (2r) relative to two of the x, y, z lattice axes.

More complex models, such as a 3D-2 model includes 101 velocities and a 2D-2 model includes 37 velocities also may be used. The velocities are more clearly described by their component along each axis as documented in Tables 1 and 2 respectively.

For the three-dimensional model 3D-2, of the 101 velocities, one represents particles that are not moving (Group 1); three sets of six velocities represent particles that are moving at either a normalized speed (r), twice the normalized speed (2r), or three times the normalized speed (3r) in either the positive or negative direction along the x, y or z axis of the lattice (Groups 2, 4, and 7); three sets of eight represent particles that are moving at the normalized speed (r), twice the normalized speed (2r), or three times the normalized speed (3r) relative to all three of the x, y, z lattice axes (Groups 3, 8, and 10); twelve represent particles that are moving at twice the normalized speed (2r) relative to two of the x, y, z lattice axes (Group 6); twenty four represent particles that are moving at the normalized speed (r) and twice the normalized speed (2r) relative to two of the x, y, z lattice axes, and not moving relative to the remaining axis (Group 5); and twenty four represent particles that are moving at the normalized speed (r) relative to two of the x, y, z lattice axes and three times the normalized speed (3r) relative to the remaining axis (Group 9).

For the two-dimensional model 2D-2, of the 37 velocities, one represents particles that are not moving (Group 1); three sets of four velocities represent particles that are moving at either a normalized speed (r), twice the normalized speed (2r), or three times the normalized speed (3r) in either the positive or negative direction along either the x or y axis of the lattice (Groups 2, 4, and 7); two sets of four velocities represent particles that are moving at the normalized speed (r) or twice the normalized speed (2r) relative to both of the x and y lattice axes; eight velocities represent particles that are moving at the normalized speed (r) relative to one of the x and y lattice axes and twice the normalized speed (2r) relative to the other axis; and eight velocities represent particles that are moving at the normalized speed (r) relative to one of the x and y lattice axes and three times the normalized speed (3r) relative to the other axis.

The LBM models described above provide a specific class of efficient and robust discrete velocity kinetic models for numerical simulations of flows in both two- and three-dimensions. A model of this kind includes a particular set of discrete velocities and weights associated with those velocities. The velocities coincide with grid points of Cartesian coordinates in velocity space which facilitates accurate and efficient implementation of discrete velocity models, particularly the kind known as the lattice Boltzmann models. Using such models, flows can be simulated with high fidelity.

Figure 6:
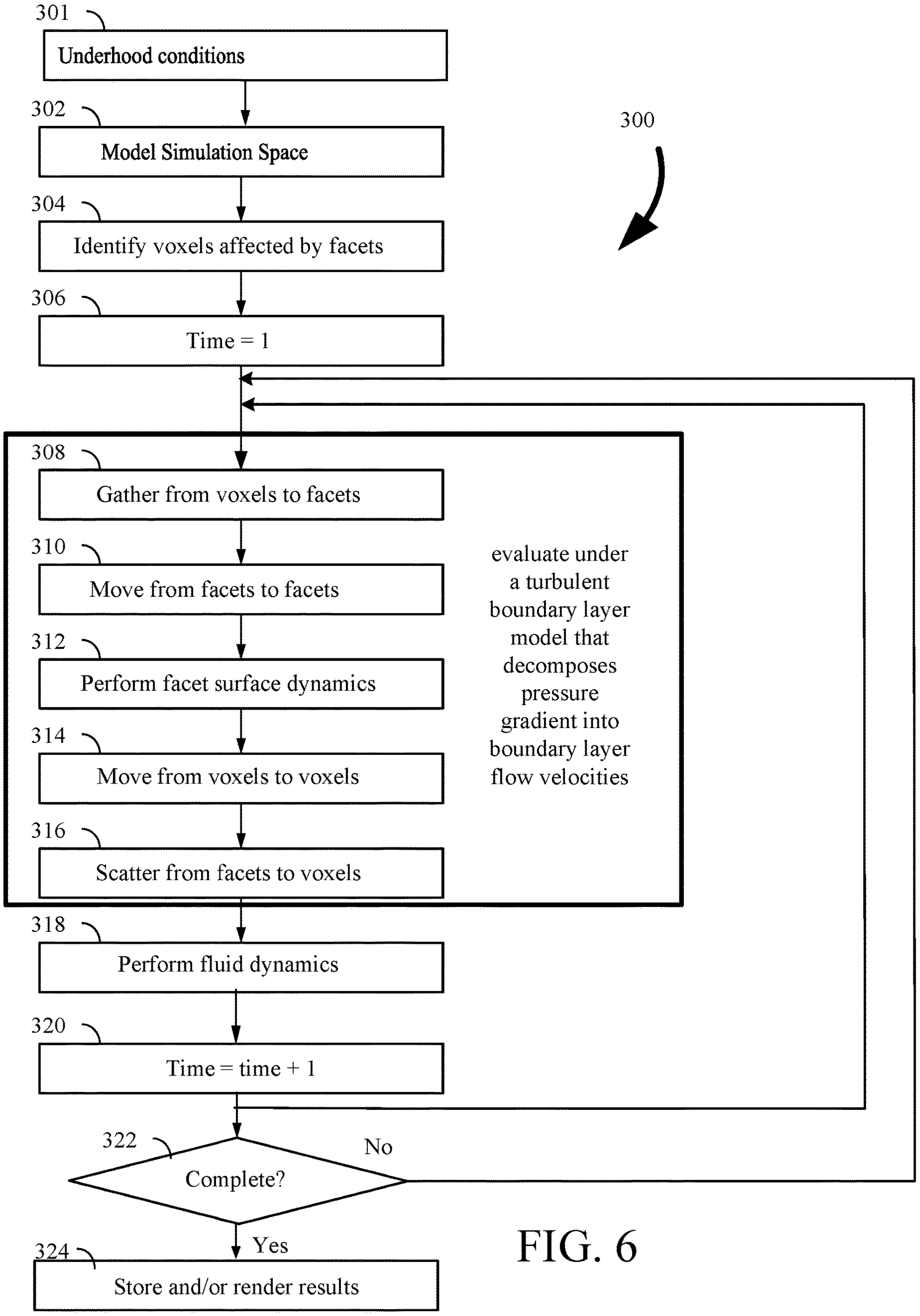
FIG. 6 is a flow chart of a procedure for determining underhood conditions followed by a physical process simulation system.

Referring to FIG. 6, a physical process simulation system operates according to a procedure 300 to simulate a physical process such as fluid flow. Prior to the simulation, the determined underhood conditions is received 301, and a simulation space is modeled as a collection of voxels (step 302). Typically, the simulation space is generated using a computer-aided-design (CAD) program. For example, a CAD program could be used to draw the underhood components of a vehicle. Thereafter, data produced by the CAD program is processed to add a lattice structure having appropriate resolution and to account for objects and surfaces within the simulation space.

The resolution of the lattice may be selected based on the Reynolds number of the system being simulated. The Reynolds number is related to the viscosity (ν) of the flow, the characteristic length (L) of an object in the flow, and the characteristic velocity (u) of the flow:

$$Re = uL/\nu. \quad \text{Eq. (I-3)}$$

The characteristic length of an object represents large scale features of the object. For example, if flow around a component in the underhood environment is being simulated, the height of the component might be considered to be the characteristic length. When flow around small regions of an object is of interest, the resolution of the simulation may be increased, or areas of increased resolution may be employed around the regions of interest. The dimensions of the voxels decrease as the resolution of the lattice increases.

The state space is represented as $f_i(x, t)$, where $f_i$ represents the number of elements, or particles, per unit volume in state i (i.e., the density of particles in state i) at a lattice site denoted by the three-dimensional vector x at a time t. For a known time increment, the number of particles is referred to simply as $f_i(x)$. The combination of all states of a lattice site is denoted as $f(x)$.

The number of states is determined by the number of possible velocity vectors within each energy level. The velocity vectors consist of integer linear speeds in a space having three dimensions: x, y, and z. The number of states is increased for multiple-species simulations.

Each state i represents a different velocity vector at a specific energy level (i.e., energy level zero, one or two). The velocity $c_i$ of each state is indicated with its "speed" in each of the three dimensions as follows:

$$c_i = (c_{i,x}, c_{i,y}, c_{i,z}). \quad \text{Eq. (I-4)}$$

The energy level zero state represents stopped particles that are not moving in any dimension, i.e. $c_{stopped}=(0, 0, 0)$. Energy level one states represent particles having a ±1 speed in one of the three dimensions and a zero speed in the other two dimensions. Energy level two states represent particles having either a ±1 speed in all three dimensions, or a ±2 speed in one of the three dimensions and a zero speed in the other two dimensions.

Generating all of the possible permutations of the three energy levels gives a total of 39 possible states (one energy zero state, 6 energy one states, 8 energy three states, 6 energy four states, 12 energy eight states and 6 energy nine states).

Each voxel (i.e., each lattice site) is represented by a state vector f(x). The state vector completely defines the status of the voxel and includes 39 entries. The 39 entries correspond to the one energy zero state, 6 energy one states, 8 energy three states, 6 energy four states, 12 energy eight states and 6 energy nine states. By using this velocity set, the system can produce Maxwell-Boltzmann statistics for an achieved equilibrium state vector.

During simulation when the process encounters in the mesh a location corresponding to a surface of a physical object or the device the process performs the above functions by evaluating under the turbulent boundary layer model that decomposes pressure gradient into boundary layer flow velocities, as discussed above.

Figure 7:
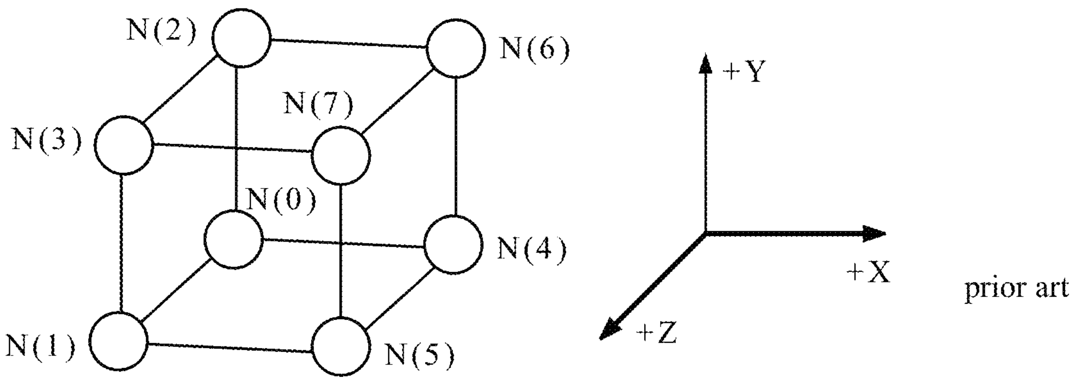
FIG. 7 is a perspective view of a microblock (prior art).

Referring now to FIG. 7, a microblock is illustrated. For processing efficiency, the voxels are grouped in 2×2×2 volumes called microblocks. The microblocks are organized to permit parallel processing of the voxels and to minimize the overhead associated with the data structure. A short-hand notation for the voxels in the microblock is defined as $N_i(n)$, where n represents the relative position of the lattice site within the microblock and n E {0, 1, 2, . . . , 7}.

Figure 8A:
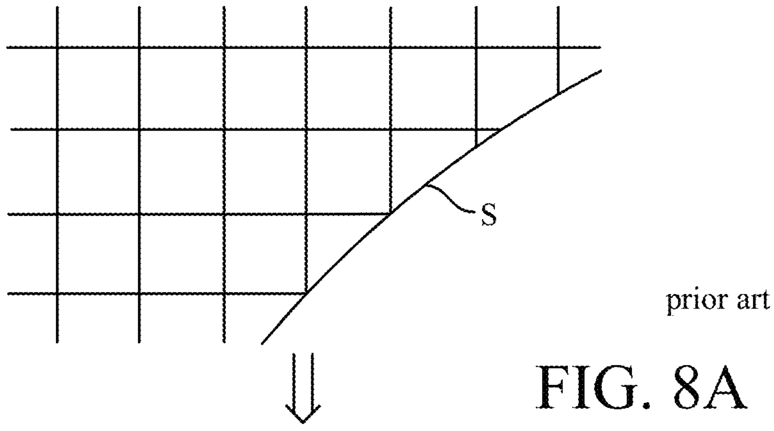
FIGS. 8A and 8B are illustrations of lattice structures (prior art).
Figure 8B:
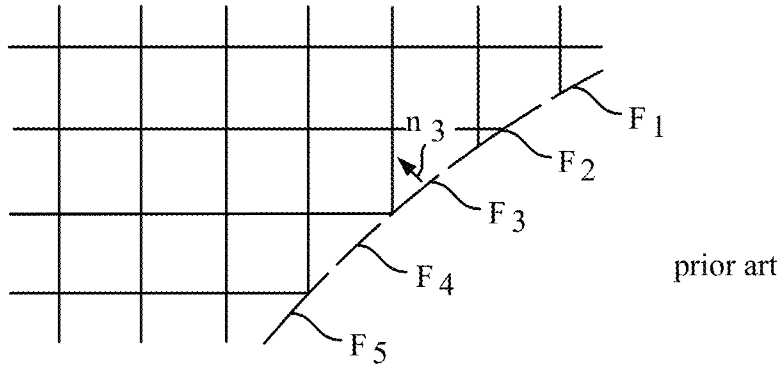

Referring to FIGS. 8A and 8B, a surface S (FIG. 8A) is represented in the simulation space (FIG. 8B) as a collection of facets $F_\alpha$:

$$S = \{F_\alpha\} \quad \text{Eq. (I-5)}$$

where α is an index that enumerates a particular facet. A facet is not restricted to the voxel boundaries, but is typically sized on the order of or slightly smaller than the size of the voxels adjacent to the facet so that the facet affects a relatively small number of voxels. Properties are assigned to the facets for the purpose of implementing surface dynamics. In particular, each facet $F_\alpha$ has a unit normal ($n=_\alpha$), a surface area ($A_\alpha$), a center location ($x_\alpha$), and a facet distribution function ($f_i(\alpha)$) that describes the surface dynamic properties of the facet.

Figure 9:
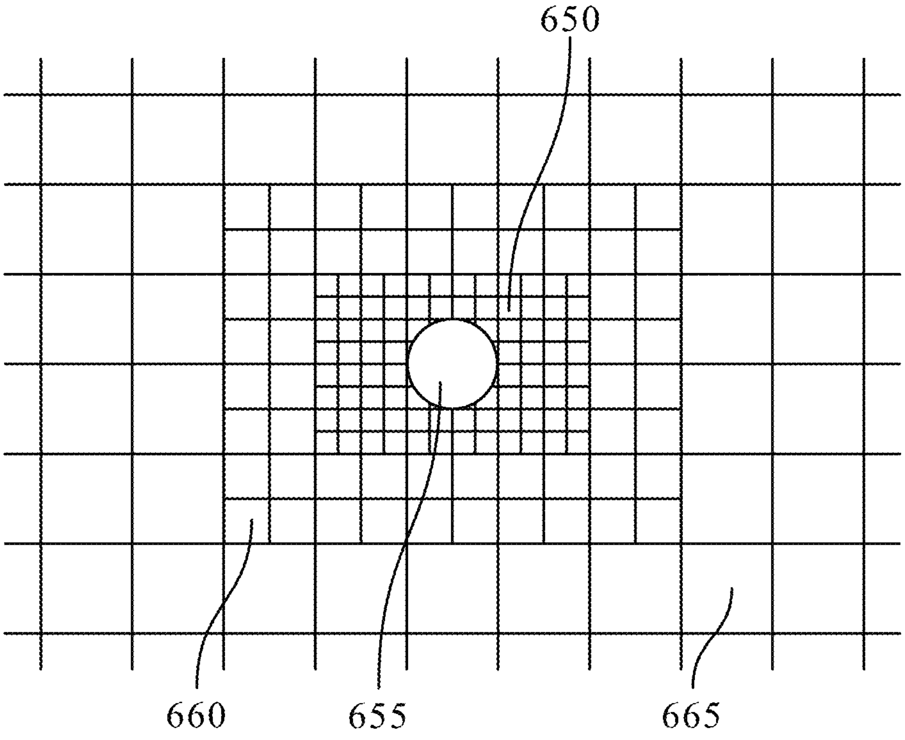
FIG. 9 prior art
FIGS. 9 and 10 illustrate variable resolution techniques (prior art).

Referring to FIG. 9, different levels of resolution may be used in different regions of the simulation space to improve processing efficiency. Typically, the region 650 around an object 655 is of the most interest and is therefore simulated with the highest resolution. Because the effect of viscosity decreases with distance from the object, decreasing levels of resolution (i.e., expanded voxel volumes) are employed to simulate regions 660, 665 that are spaced at increasing distances from the object 655.

Figure 10:
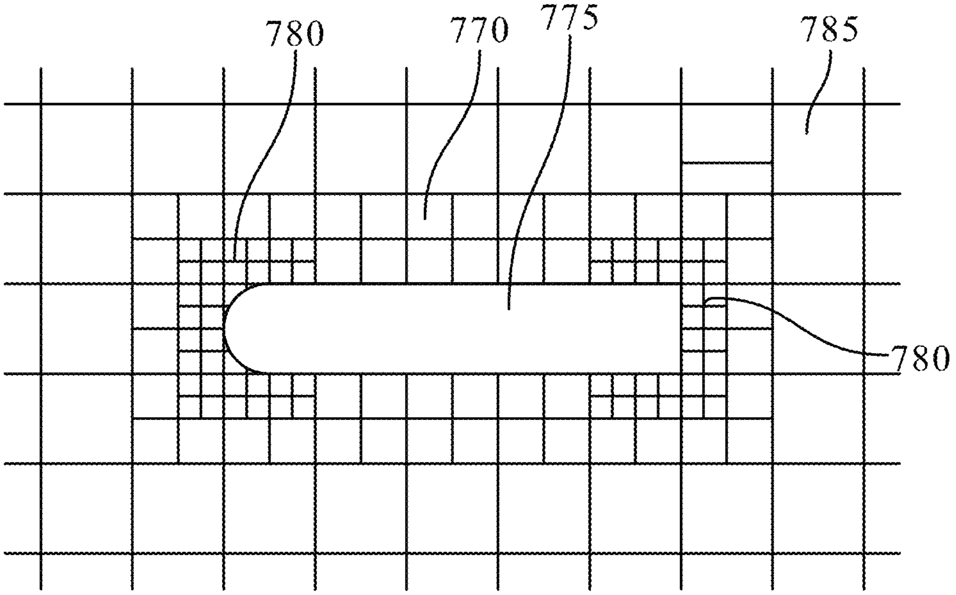
FIG. 10 prior art

Similarly, as illustrated in FIG. 10, a lower level of resolution may be used to simulate a region 770 around less significant features of an object 775 while the highest level of resolution is used to simulate regions 780 around the most significant features (e.g., the leading and trailing surfaces) of the object 775. Outlying regions 785 are simulated using the lowest level of resolution and the largest voxels.

Identify Voxels Affected By Facets

Referring again to FIG. 6, once the simulation space has been modeled (step 302), voxels affected by one or more facets are identified (step 304). Voxels may be affected by facets in a number of ways. First, a voxel that is intersected by one or more facets is affected in that the voxel has a reduced volume relative to non-intersected voxels. This occurs because a facet, and material underlying the surface represented by the facet, occupies a portion of the voxel. A fractional factor $P_f(x)$ indicates the portion of the voxel that is unaffected by the facet (i.e., the portion that can be occupied by a fluid or other materials for which flow is being simulated). For non-intersected voxels, $P_f(x)$ equals one.

Voxels that interact with one or more facets by transferring particles to the facet or receiving particles from the facet are also identified as voxels affected by the facets. All voxels that are intersected by a facet will include at least one state that receives particles from the facet and at least one state that transfers particles to the facet. In most cases, additional voxels also will include such states.

Figure 11:
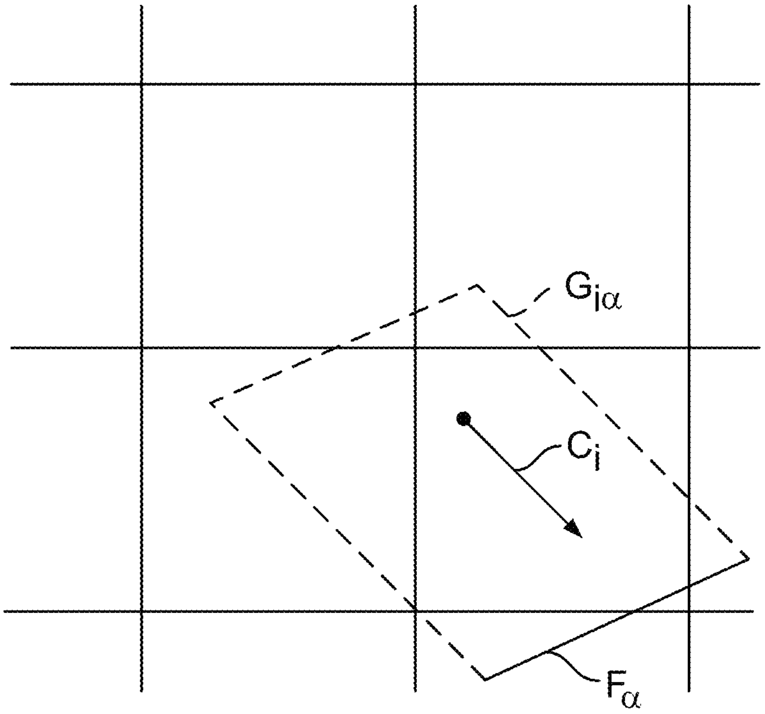
FIG. 11 prior art
FIG. 11 illustrates regions affected by a facet of a surface (prior art).

Referring to FIG. 11, for each state i having a non-zero velocity vector $c_i$, a facet $F_\alpha$ receives particles from, or transfers particles to, a region defined by a parallelepiped $G_{i\alpha}$ having a height defined by the magnitude of the vector dot product of the velocity vector $c_i$ and the unit normal $n_\alpha$ of the facet ($|c_i n_i|$) and a base defined by the surface area $A_\alpha$ of the facet so that the volume Via of the parallelepiped $G_{i\alpha}$ equals:

$$V_{ia} = |c_i n_a| A_a \qquad \text{Eq. (I-6)}$$

The facet $F_\alpha$ receives particles from the volume $V_{i\alpha}$ when the velocity vector of the state is directed toward the facet ($|c_i n_i|<0$), and transfers particles to the region when the velocity vector of the state is directed away from the facet ($|c_i n_i|>0$). As will be discussed below, this expression must be modified when another facet occupies a portion of the parallelepiped $G_{i\alpha}$, a condition that could occur in the vicinity of non-convex features such as interior corners.

The parallelepiped $G_{i\alpha}$ of a facet $F_\alpha$ may overlap portions or all of multiple voxels. The number of voxels or portions thereof is dependent on the size of the facet relative to the size of the voxels, the energy of the state, and the orientation of the facet relative to the lattice structure. The number of affected voxels increases with the size of the facet. Accordingly, the size of the facet, as noted above, is typically selected to be on the order of or smaller than the size of the voxels located near the facet.

The portion of a voxel N(x) overlapped by a parallelepiped $G_{i\alpha}$ is defined as $V_{i\alpha}(x)$. Using this term, the flux $\Gamma_{i\alpha}(x)$ of state i particles that move between a voxel N(x) and a facet $F_\alpha$ equals the density of state i particles in the voxel ($N_i(x)$) multiplied by the volume of the region of overlap with the voxel ($V_{i\alpha}(x)$):

$$\Gamma_{ia}(x) = N_i(x) V_{ia}(x). \qquad \text{Eq. (I-7)}$$

When the parallelepiped $G_{i\alpha}$ is intersected by one or more facets, the following condition is true:

$$V_{ia} = \sum V_a(x) + \sum V_{ia}(\beta) \qquad \text{Eq. (I-8)}$$

where the first summation accounts for all voxels overlapped by $G_{i\alpha}$ and the second term accounts for all facets that intersect Ga. When the parallelepiped $G_{i\alpha}$ is not intersected by another facet, this expression reduces to:

$$V_{ia} = \sum V_{ia}(x). \qquad \text{Eq. (I-9)}$$

Perform Simulation

Once the voxels that are affected by one or more facets are identified (step 304), a timer is initialized to begin the simulation (step 306). During each time increment of the simulation, movement of particles from voxel to voxel is simulated by an advection stage (steps 308-316) that accounts for interactions of the particles with surface facets. Next, a collision stage (step 318) simulates the interaction of particles within each voxel. Thereafter, the timer is incremented (step 320). If the incremented timer does not indicate that the simulation is complete (step 322), the advection and collision stages (steps 308-320) are repeated. If the incremented timer indicates that the simulation is complete (step 322), results of the simulation are stored and/or displayed (step 324).

Underhood Fluid Model

Figure 12:
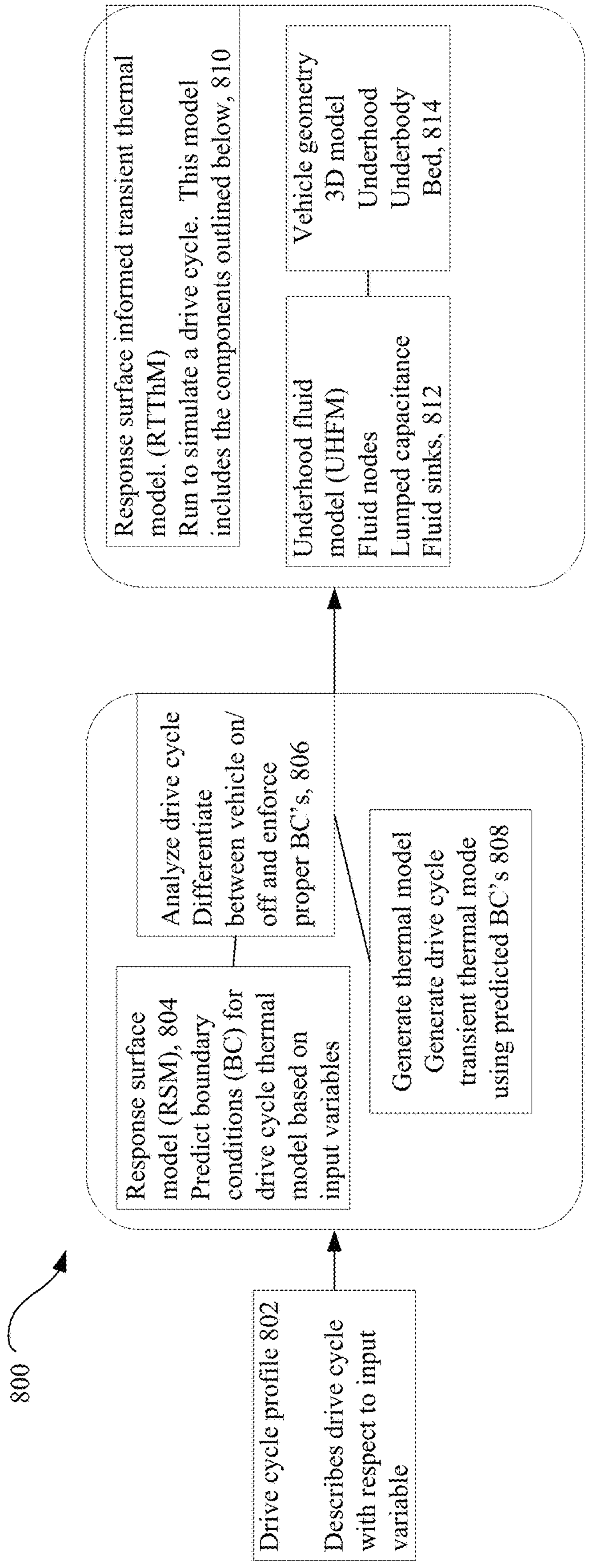
FIG. 12 shows an automated process for determining underhood conditions that can be used in various applications such as fluid simulations.

Referring to FIG. 12, a process 800 for providing an underhood fluid model (UHFM) 812 is shown. The underhood fluid model 812, as shown in FIG. 12, has components that include source (fluid) nodes, sink (fluid) nodes, and lumped thermal capacity (or capacities or capacitance, as appropriate).

A drive cycle profile 802 is used as input to a response surface model 804. The response surface model 804 predicts boundary conditions for the drive cycle thermal model. Scripts 806 analyze the drive cycle and predicted boundary conditions from the response surface models 804 and generate 808 a drive cycle transient thermal model using the predicted boundary conditions.

The scripts 806 use the predicted values of Air Temperatures, Flow Rates, HTC (heat transfer coefficient), NWT (near wall temperature), and Calculated $\dot{Q}$ (heat), as discussed below from the predicted boundary conditions coming from the response surface models 804. Initialization of the transient thermal model 808 is based on the predicted values and obeys the conservation of mass law.

The UHFM or underhood fluid model 812 handles the two basic cases—Powertrain ON and Powertrain OFF.

As shown in FIG. 12, the underhood fluid model 812 (UHFM) can be a component of a larger model such as a response surface informed transient thermal model (RITThM) 810. The (UHFM) 812 involves modeling of a fluid source, a fluid sink, and plural fluid nodes (for the example vehicle three fluid nodes are used), and a thermal lumped capacitance. These components are contained within the response surface informed transient thermal model 810. In this example, the three fluid nodes are an upstream air node, a radiator air node, and a underhood fluid node. However, embodiments are not limited to one underhood fluid node but can incorporate several underhood fluid nodes depending on the underhood air temperature distribution (i.e., whether the air temperature distribution is well-mixed, e.g., somewhat uniform vs. whether the air temperature distribution is segmented, e.g., uniform only in zones or segments and not uniform between or among zones).

Using the response surface models 804, the air temperature upstream and downstream of a cooling package (air on/air off temperatures under the hood), and air mass flow rate passing through the cooling package are predicted. Based on this information the cooling package heat rejection is calculated. As used herein a cooling package is comprised of one or more heat exchangers, e.g., a radiator, an air conditioner condenser, a transmission fluid cooler, etc.

All of this information is then passed to a response surface informed transient thermal model 810 such as a PowerTHERM model (Dassault Systèmes Simulia Corp.), and used to initialize the underhood fluid model 812. The underhood fluid model 812 is used to model heat rejection into the air flow and convective heat transfer into the underhood. The response surface informed transient thermal model is not coupled to a computational fluid dynamics (CFD) simulation.

The cooling package is used as a model element for having a correct air temperature when the vehicle is in an "on" state and for rejecting an amount of heat into the air to obtain a final air temperature in the vehicle off state, which air at the final air temperature migrates into the underhood. The radiator is generally the last heat exchanger before the vehicle underhood, and the dominant source of heat being injected into the air flow, and thus as used herein it is referred to as the "Radiator Air Node." On most passenger vehicles, this is case.

However, an alternative would be to take the air temperature in the "on" state, before the entire cooling package, calculate the total heat rejected from all sources and then determine the air temperature in the "off" state, as an equally valid approach. Here the starting point is chosen as ahead of the radiator, because the radiator air "on" temperatures can be well-characterized by surrogate models used for predicting transient thermal simulation boundary conditions.

The connectivity of the fluid nodes in the underhood fluid model 812 is as follows: The "air on" temperature and air mass flow rate dictate the air temperature applied at the upstream air node while the air mass flow rate is applied at the advection link between the fluid source and upstream air node. The upstream air node is connected with an advection link to the radiator air node. The radiator air node is connected with an advection link to the underhood fluid node(s). If multiple underhood fluid nodes are used, several fluid nodes will likely (though not necessarily) be connected between each other with an advection link, and not directly to the radiator air node. If multiple underhood fluid nodes, then the nodes that are influencing the parts closest to the cooling package will be connected to the radiator air node (i.e., "cooling package air node.") Those underhood fluid nodes influencing parts further downstream will likely be connected to nodes influencing parts further upstream, and not necessarily directly to the radiator air node with an advection link. In order to maintain conservation of mass the sum of all outgoing mass flows will equal the mass flow going from the underhood air node(s) to fluid sink.

The underhood fluid model 812 is used to model the two types of basic cases in daily vehicle operations; powertrain ON and powertrain OFF. Powertrain ON basic cases include vehicle in motion or vehicle stopped with powertrain ON (i.e., a hot soak). The powertrain OFF basic case is a specific kind of hot soak case known as a "key-off" hot soak.

Figure 13:
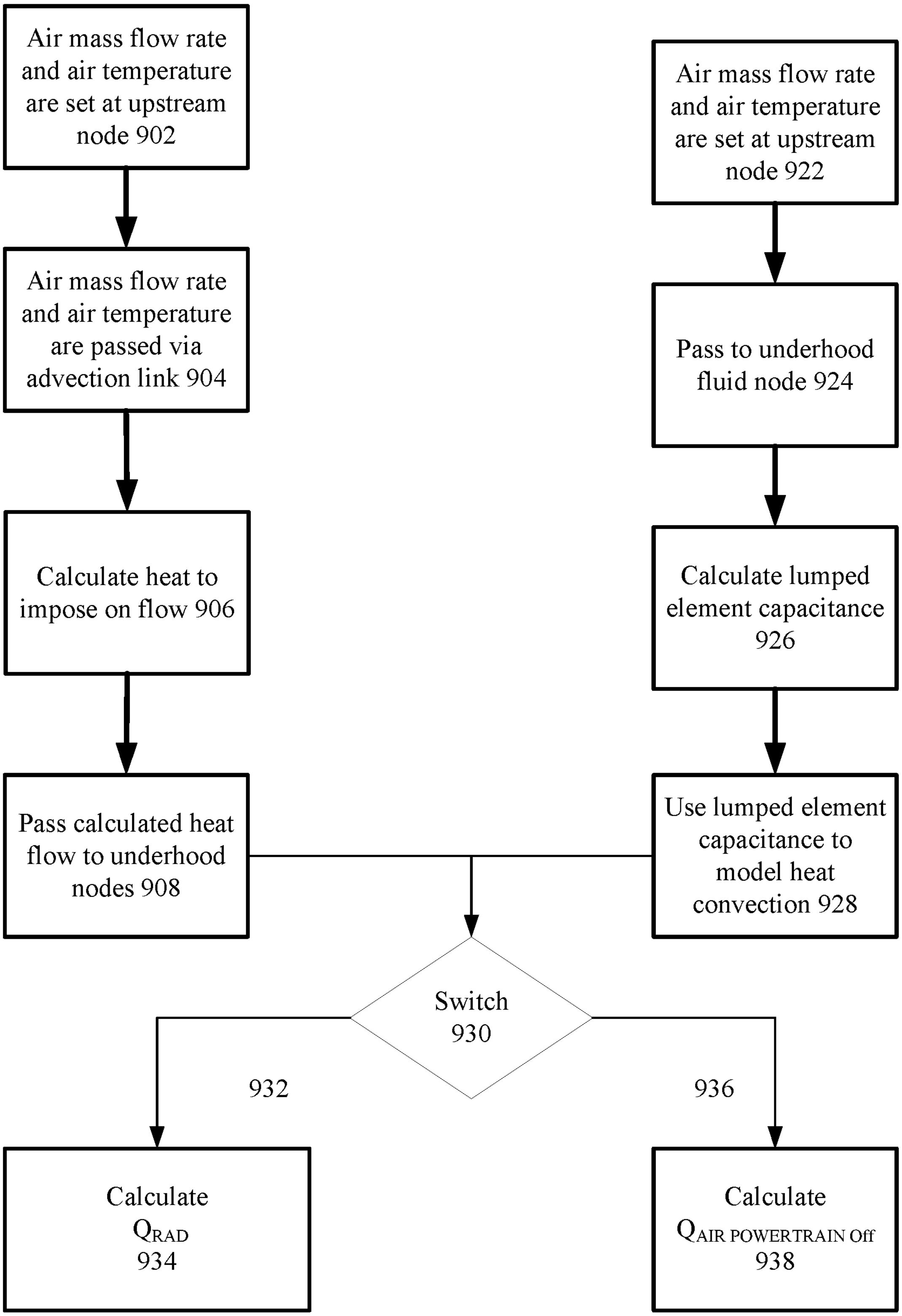
FIG. 13 is a flow chart depicting aspects of the process depicted in FIG. 12.

Referring now to FIG. 13, for the case where the vehicle powertrain is ON, the underhood fluid model 812 works as follows. As stated previously, the air mass flow rate and air temperature is set at the upstream air node 902 and advection link between the upstream air node and fluid source is provided. The air mass flow rate and air temperature are passed through the advection link to the radiator air node 904. Based on a calculated heat rejection value or curve, a certain amount of heat is imposed on the flow 906 (i.e. modelling the rejection of heat from the cooling package), and the heated flow is passed by an advection link to the underhood fluid nodes 908, and thus to the underhood components (discussed further below).

For the case where the vehicle powertrain is OFF (i.e. key-off hot soak), again the upstream air temperature and mass flow rate are set 922 in the manner described for the powertrain ON case. At the radiator air node, no heat is imposed (the radiator does not physically reject heat) and the heat is simply passed 924 to the underhood fluid node. Even though no heat is rejected from the radiator, during the powertrain OFF phase the radiator acts a heat capacitor. A lumped thermal capacitance is calculated 926 and the calculated lumped thermal capacitance is used 928 for modeling the natural heat convection during the powertrain OFF case.

By recognizing the difference in the mechanisms that provide heat to the underhood between these two cases, it is possible to implement a switch 930 into the underhood fluid model 812. The boundary conditions used to implement this so-called "switch" 930 are as follows:

If powertrain ON 932, the radiator is rejecting heat, calculated 934 by $$\dot{Q}_{RAD} \text{ or } \dot{Q}_{air,Powertrain\ ON} = c_{p,air}\dot{m}_{air}\Delta T_{RAD\ on/off}$$

If powertrain OFF 936, the radiator is hot, heat is convected into the underhood through a lumped capacitance, and the initial temperature of the lumped capacitance is assumed to be the final air off temperature before the vehicle shutoff with the HTC calculated by the equation below:

$$HTC_{lumped\ capacitance} = (\dot{m}_{air}K_c)^{-1}$$

Based on the HTC of a lumped capacitance, the heat rate rejected can be calculated 938 as follows:

$$\dot{Q}_{air,Powertrain\ OFF} = HTC\ A_{exchange}\Delta T_{\text{rad}\ on/off}$$

The switch 930 is implemented in the following manner. While the powertrain is ON, the radiator air node rejects heat into the flow, and is the dominant convective heat source into the underhood. This means the HTC boundary condition of the lumped capacitance is assumed to be zero at points in the drive cycle where the powertrain ON, and thus irrespective of the initial temperature of the lumped capacitance, the lumped element capacitance will not convect heat to other components. However, when the powertrain is OFF, the radiator does not reject heat into the passing flow, thus the imposed heat boundary condition (i.e. the heat rejection of the radiator) is forced to zero and the HTC of the lumped capacitance is based on the equation shown above.

All components in the model shown in FIG. 12 (vehicle geometry 814) are initialized to a HTC and NWT values or curves based on the drive cycle simulated, and how frequently the convective boundary conditions need to be updated. By default, all non-underhood components use the convective boundary conditions (HTCs/NWTs) predicted by the response surface model (RSM) or a surrogate model.

Figure 15:
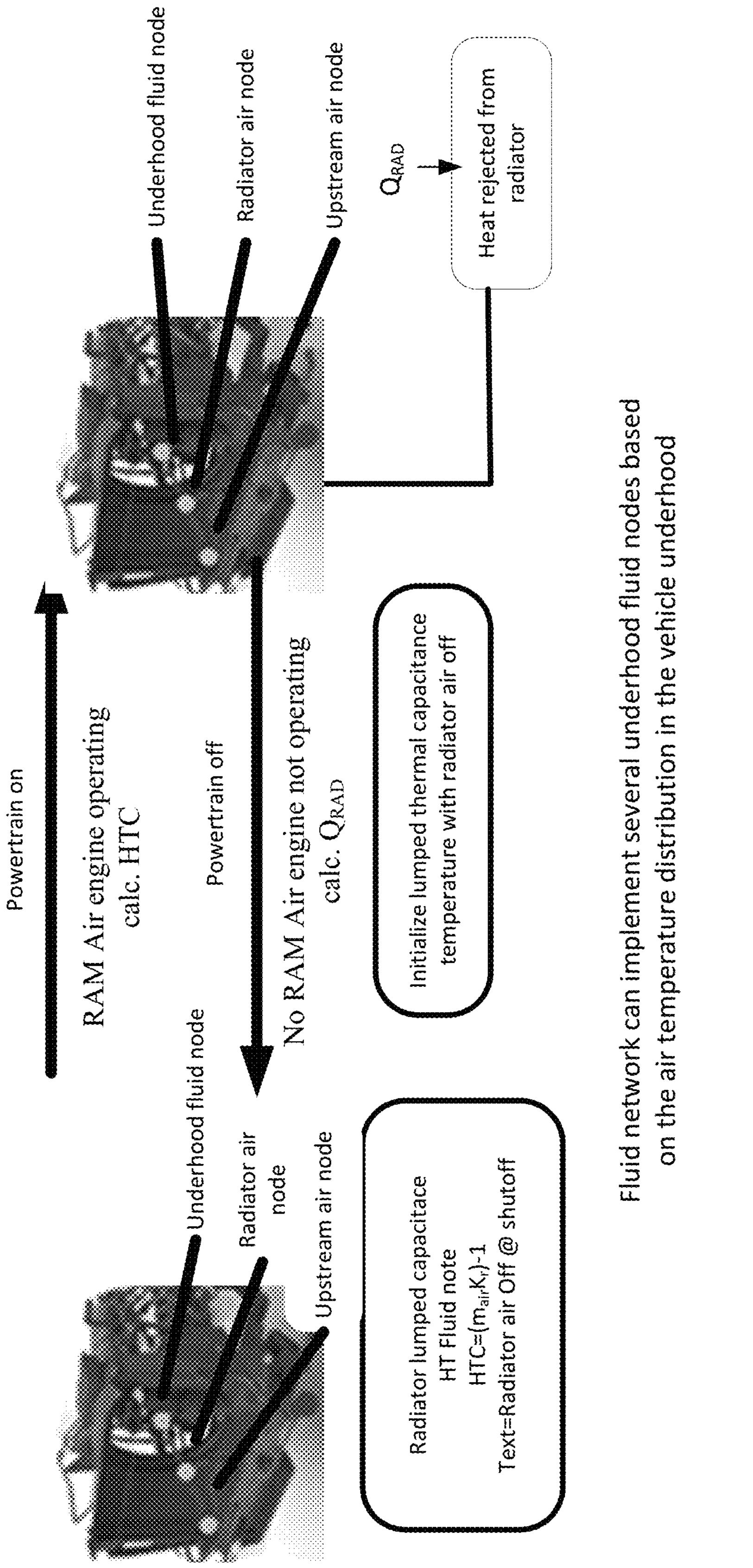
FIG. 15 is a diagram that depicts heat flows among underhood fluid nodes based on air distribution in a vehicle.

For components in the underhood region (see underhood fluid node, radiator air node and upstream air node components in FIG. 15), the NWT boundary condition is set to the underhood fluid node thus implementing the underhood fluid model 812 in a transient thermal simulation. The transient thermal simulation is run with the underhood fluid model 812 implemented to model vehicle thermal behavior over the course of a drive cycle test.

Building a Transient Thermal Model

The Transient thermal model 810 (FIG. 12) uses predictions of the characterization a response surface model (RSM) as a substitute (surrogate) for coupling a flow model to the thermal model. Discussion of RSM is found at A. I. Khuri and J. A. Cornell. *Response Surfaces: Design and Analyses.* Marcel Dekker, 1996. This is accomplished in several discrete steps. Using a surrogate model in place of the flow based solvers PowerFLOW (Dassault Systèmes Simulia Corp.) and PowerCOOL (Dassault Systèmes Simulia Corp.) works only if the characteristic time of those simulations is significantly smaller than the time-accurate model they would be used to update. In the case of PowerCOOL and the velocity field in PowerFLOW, this is a valid assumption as the characteristic time for these quantities is one or more orders of magnitude smaller than the time step size in the transient thermal simulation.

Building a transient thermal model 810 that contains the underhood fluid model 812 involves producing a RSM using a "Design of Experiments" or design space study. A "design of experiments" is a methodology used to build a response surface model. In this process, after defining a design space or performance envelope, software chooses simulation points to obtain data from, which are used to build the RSM. The goal of this type of study is to characterize certain objective functions of interest. To characterize these objective functions (also known as "response variables"), CFD and thermal coupled simulations are used.

Objective functions can be parameters such as overall vehicle $C_D$, or component averaged HTC and NWT. For this model the objective function are those parameters that are required for running a transient thermal simulation. Once objective functions are determined, the input variables and their ranges are determined. The set of input variables and their ranges are known as the performance envelope. This procedure is carefully navigated to ensure that any drive cycle that is desired to be simulated can be defined with respect to the input variables outlined and the operating points of the drive cycle fall within the performance envelope.

Once the performance envelope is defined simulation points within the performance envelope are chosen in a controlled manner (Design of Experiments). This can be done through tools which contain Space-Filling algorithms. Upon the completion of the CFD and thermal coupled simulations, the objective function values are extracted from the simulation results. Model generation tools are used to generate response surface models (surrogate models) that predict the objective functions at any operating point within the performance envelope. Additional CFD and thermal simulations are run to update the RSM until its predictions are satisfactory.

Figure 14:
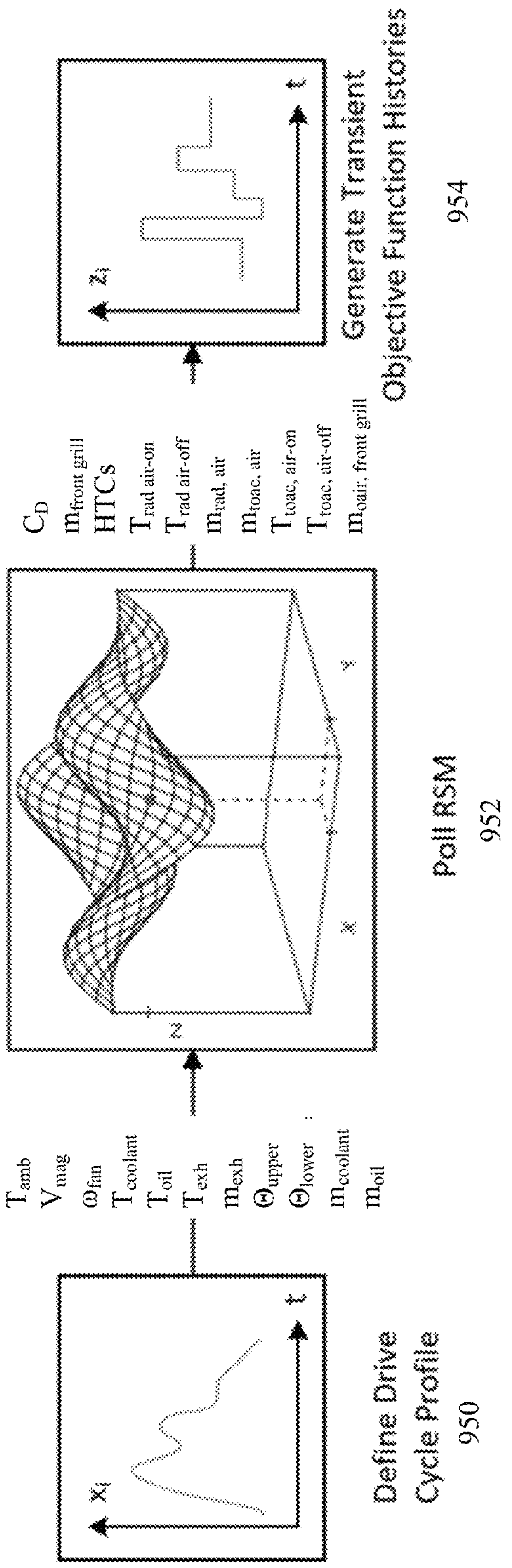
FIG. 14 is a flow diagram.

Upon the completion of the "Design of Experiments" phase, the RSMs are implemented into the procedure outlined on FIGS. 12 and 14. If the drive cycle desired to be simulated has operating points defined consistent with the performance envelope, the RSMs can be polled to obtain transient thermal simulation boundary conditions. Once polled and formatted correctly, these boundary conditions can be imported into a transient thermal simulation for simulating a drive cycle.

Referring now to FIG. 14, a flow of this process is shown. Starting at define drive cycle profile 950 parameter valves are outputted from the profile and used as inputs to the response surface model (RSM) 952. From the response surface model (RSM) a second set of parameters are provided as input to generate transient objective functions histories (response variables) 954.

Transient Thermal Model

The Transient thermal model 810 (FIG. 12) runs for the drive cycle test time, and constantly updates the convective boundary conditions of the underhood and non-underhood components. Recall that non-underhood components simply use the NWTs and HTCs predicted by the RSM models. For underhood components the HTC predicted by the RSM is used, while the NWT is set by the underhood fluid model 812 which is, in turn, heated at a rate predicted by the RSM.

Underhood Fluid Node Network

During a transient thermal simulation, the underhood fluid model 812 accounts for the two most basic cases in vehicle operations; powertrain ON and OFF. In order to account for both cases, the underhood fluid model 812 includes, and in some implementations could consist of, the following components, which are connected in the manner described below.

The underhood fluid model 812 includes a fluid source, fluid sink, one or more fluid nodes, and in key-off cases, one or more thermal lumped capacitance. In drive cycles not containing a key-off region, a thermal lumped capacitance is not required. This means it may or may not be included in the underhood fluid model. The fluid nodes are ordered to match flow behavior seen in real-world vehicle underhood environments; the upstream air node is first, followed by the radiator air node(s), and finally the underhood air node(s).

All the fluid nodes are connected through advection links. The fluid source is connected with an advection link to the upstream air node, and the fluid sink is connected by an advection link to underhood air node. The fluid sink is used to maintain mass continuity within the simulation. These nodes have the material properties of air and a fixed volume. Accordingly, each node has a thermal mass and inertia. The temperature of each node changes as it exchanges mass with other fluid nodes and heat with each part as a function of that part's convective HTC. The amount of heat in that exchange is governed in turn by the temperature of the node, which is also considered the near wall temperature on any component connected to the node.

The mechanics of how the underhood fluid model 812 operates between the two basic cases outlined above can be described as follows. For the powertrain ON case, fluid temperature and flow rate coming from the fluid source to the upstream air node are set by the boundary conditions (i.e. initialization parameters) imported from the RSM predictions (see FIGS. 12 and 14). The fluid is passed to the radiator air node by an advection link. At the radiator air node a heat value is imposed on the fluid. This is the heat calculated by the predictions made by the RSM, and models the heat rejected from a radiator into the passing air flow going to the underhood. Next the fluid is passed from the radiator air node to the underhood fluid node, where the heat is convected to the underhood components.

For the case where the powertrain is OFF the mechanics of the underhood fluid model 812 work as follows. In this case again the fluid coming from the fluid source to upstream air node is set to a predicted flow rate and temperature. It is passed by an advection link to the radiator air node. From a vehicle operations standpoint, if the powertrain is off the radiator is not actively rejecting heat (coolant is not being pumped) into the passing air flow. In this case, the imposed heat rate at the radiator air node is forced to zero. Additional heat is rejected into the air flow by means of connection to a lumped capacitance. A lumped capacitance is connected to underhood air node by way of setting the NWT of the lumped capacitance to the underhood fluid node.

A lumped capacitance is by definition an "empty" part with no geometry for which all the same boundary conditions and properties can be assign as is done with a component that is represented by some geometry. Since the lumped capacitance is used to represent a hot radiator mass, volume and material properties are assigned based on the radiator design. The HTC value (one of the convective boundary conditions required) is calculated based on the predicted boundary conditions from the RSM and imported into the transient thermal model 810. The NWT value of the lumped capacitance is set to the Underhood Fluid Node. This setup models physical phenomena seen in heat exchangers during key-off operation as thermal mass that continue to reject heat into the underhood environment. For the case where the powertrain is ON, the radiator is an active and assigned heat source and its thermal inertia does not need to be modelled necessitating a separate lumped capacitance for the powertrain OFF case. The lumped capacitance initial temperature is assumed to be the final radiator air node air off temperature. This means that each separate shut-off region in the drive cycle test requires a separate lumped capacitance.

Based on the description of the Underhood Fluid Node mechanics described above, a switch mechanism can be implemented to use to model cooling package heat rejection to the underhood fluid node.

Referring now to FIG. 15, a depiction useful for understanding the underhood fluid model UHFM 812 is shown. The figure shows as dots representations of the underhood fluid node, radiator air node and upstream air node, and a calculation for when there is ram air and the powertrain is on. Also shown is a calculation when there is no ram air or the engine is not operating. The UHFM 812 offers several advantages with respect to existing approaches, such as the UHFM 812 enables simulating multiple vehicle powertrain operating modes, at lower computation costs, as well as, monetary and time costs.

The dots in FIG. 15 are a visual representative of the nodes. The nodes represent heat transfers among components in the underhood environment, providing a representation of a volume of fluid that would normally be simulated using many thousands or more volume elements with many degrees of freedom. Thus a node is a reduced order model of heat transfers. These nodes need not have degrees of freedom, but rather are tightly constrained computer constructs. The nodes are chosen based on upstream ambient conditions, cooling package node, one source of heat and advection in and out are known quantities. The underhood nodes may be more complicated, but are chosen based on knowing that a fixed amount of energy in a mass flow travels in and out from the cooling package node with remaining heat transfer being calculated.

The UHFM 812 eliminates the need for coupling Thermal and CFD models, thus requiring fewer computing resources and hence faster turn-around time. Simulation can run in a shorter amount of time, then other conventional methodologies.

For a thermal simulation of a standard vehicle configuration, thermal simulation inputs or temperature distributions are used where the cooling package is placed upstream of the powertrain and air flow is directed from the cooling package to the underhood compartment of the vehicle.

The following boundary conditions are used for initializing a thermal simulation. These include average air temperatures upstream and downstream of one or all heat exchangers ($T_{amb}$; $T_{coolant}$; $T_{oil}$; $T_{exh}$; $T_{rad\ air\text{-}on}$; $T_{rad\ air\text{-}off}$; $T_{toac\ air\text{-}on}$; $T_{toac\ air\text{-}off}$. Also included are the total/average air mass flow rate through one or all heat exchangers ($m_{coolant}$, $m_{oil}$; $m_{rad}$, air; $m_{to\ ac\ air}$; $m_{front\ grill}$). In addition, any information that can determine vehicle overall and/or powertrain operations. Vehicle Speed/Fan Speed ($V_{mag}$, $\omega_{fan}$).

Other parameters include engine RPM and water pump RPM and one or more of heat exchanger flow rates and transient thermal simulation results. Segmented or relatively uniform near wall temperatures, where the number of segments corresponds to the number of underhood fluid nodes used to set the near wall temperature for a particular segment of components.

Embodiments of the subject matter and the functional operations described in this specification can be implemented in digital electronic circuitry, tangibly-embodied computer software or firmware, computer hardware (including the structures disclosed in this specification and their structural equivalents), or in combinations of one or more of them. Embodiments of the subject matter described in this specification can be implemented as one or more computer programs (i.e., one or more modules of computer program instructions encoded on a tangible non-transitory program carrier for execution by, or to control the operation of, data processing apparatus). The computer storage medium can be a machine-readable storage device, a machine-readable storage substrate, a random or serial access memory device, or a combination of one or more of them.

The term "data processing apparatus" refers to data processing hardware and encompasses all kinds of apparatus, devices, and machines for processing data, including by way of example, a programmable processor, a computer, or multiple processors or computers. The apparatus can also be or further include special purpose logic circuitry (e.g., an FPGA (field programmable gate array) or an ASIC (application-specific integrated circuit)). In addition to hardware, the apparatus can optionally include code that creates an execution environment for computer programs (e.g., code that constitutes processor firmware, a protocol stack, a database management system, an operating system, or a combination of one or more of them).

A computer program, which can also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data (e.g., one or more scripts stored in a markup language document, in a single file dedicated to the program in question, or in multiple coordinated files (e.g., files that store one or more modules, sub-programs, or portions of code)). A computer program can be deployed so that the program is executed on one computer or on multiple computers that are located at one site or distributed across multiple sites and interconnected by a data communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry (e.g., an FPGA (field programmable gate array) or an ASIC (application-specific integrated circuit)).

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data (e.g., magnetic, magneto-optical disks, or optical disks), however, a computer need not have such devices. Moreover, a computer can be embedded in another device (e.g., a mobile telephone, a personal digital assistant (PDA), a mobile audio or video player, a game console, a Global Positioning System (GPS) receiver, or a portable storage device (e.g., a universal serial bus (USB) flash drive), to name just a few).

Computer-readable media suitable for storing computer program instructions and data include all forms of non-volatile memory on media and memory devices, including by way of example semiconductor memory devices (e.g., EPROM, EEPROM, and flash memory devices), magnetic disks (e.g., internal hard disks or removable disks), magneto-optical disks, and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback) and input from the user can be received in any form, including acoustic, speech, or tactile input. In addition, a computer can interact with a user by sending documents to and receiving documents from a device that is used by the user, for example, by sending web pages to a web browser on a user's device in response to requests received from the web browser.

Embodiments of the subject matter described in this specification can be implemented in a computing system that includes a back-end component (e.g., as a data server), or that includes a middleware component (e.g., an application server), or that includes a front-end component (e.g., a client computer having a graphical user interface or a web browser through which a user can interact with an implementation of the subject matter described in this specification), or any combination of one or more such back-end, middleware, or front-end components. The components of the system can be interconnected by any form or medium of digital data communication (e.g., a communication network). Examples of communication networks include a local area network (LAN) and a wide area network (WAN) (e.g., the Internet).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a user device (e.g., for purposes of displaying data to and receiving user input from a user interacting with the user device), which acts as a client. Data generated at the user device (e.g., a result of the user interaction) can be received from the user device at the server.

While this specification contains many specific implementation details, these should not be construed as limitations on the scope of any invention or on the scope of what can be claimed, but rather as descriptions of features that can be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing can be advantageous.

What is claimed is:

1. A computer-implemented method for modeling heat flow in a vehicle powertrain, comprises:

receiving by a computer processing system digital data of a three dimensional representation of the vehicle powertrain including an underhood fluid model including a fluid source and a fluid sink, plural fluid nodes, and a thermal lumped capacitance;

executing a transient thermal model of the vehicle powertrain that includes the underhood fluid model;

wherein executing the transient thermal model comprises performing a simulation to simulate heat flow in the underhood fluid model from the fluid source to the fluid sink through each of the plural fluid nodes; and while executing the transient thermal model, switching calculations of heat rejected to a fluid flowing through a cooling package node of the plural fluid nodes between rejected heat from a heat source and convected heat from the thermal lumped capacitance according to a modeled state of the vehicle powertrain, wherein switching calculations comprises:

when the vehicle powertrain is modeled in an on state, rejecting heat to the cooling package node from the heat source and forcing heat convection from the thermal lumped capacitance to zero; and when the vehicle powertrain is modeled in an off state, forcing the heat rejected to the cooling package node from the heat source to zero and convecting heat to the cooling package node from the thermal lumped capacitance.

2. The method of claim 1, wherein the plural fluid nodes include an upstream air node, the cooling package node, and one or more underhood fluid nodes.

3. The method of claim 2, further comprises:

executing response surface models to provide predictions of air temperature upstream and downstream of the cooling package node, and air mass flow rate passing through the cooling package node, and calculating cooling package heat rejection from the predictions.

4. The method of claim 2, wherein performing a simulation to simulate fluid flow comprises:

calculating heat rejection; and transferring heat rejection by the cooling package node to at least one of the underhood fluid nodes.

5. The method of claim 4, wherein when the vehicle powertrain is modeled in an off state, the cooling package node convects heat to the at least one underhood fluid node using the thermal lumped capacitance that is initialized with a pre-calculated value.

6. The method of claim 3 wherein the air temperature and air mass flow rate determine air temperature and mass flow rate coming from the fluid source into the upstream air node.

7. The method of claim 2 wherein the one or more underhood fluid nodes have temperatures calculated through the simulation that are initialized to a certain heat transfer coefficient (HTC) and near wall temperature (NWT), with the near wall temperature for the underhood fluid nodes being set to an underhood fluid node temperature.

8. The method of claim 1, wherein the vehicle powertrain is modeled in either an on state or in an off state.

9. The method of claim 1, wherein when plural cycles of the vehicle powertrain being in an off state is used in the method, the method further comprises:

applying from the cooling package node convected heat to plural thermal lumped capacities of different initialization temperatures.

10. The method of claim 1, wherein executing the transient thermal model further comprises executing the transient thermal model with a transient thermal model test time; and constantly updating convective boundary conditions of the underhood fluid model using response surface models and operating points on a vehicle drive cycle profile.

11. A computer system for modeling heat flow in a vehicle powertrain comprising:

one or more processors; and memory storing a computer program comprised of computer instructions that when executed by the one or more processors causes the one or more processors to:

receive digital data of a three dimensional representation of the vehicle powertrain including an underhood fluid model including a fluid source and a fluid sink, plural fluid nodes, and a thermal lumped capacitance;

execute a transient thermal model of the vehicle powertrain that includes the underhood fluid model;

wherein execution of the transient thermal model comprises performing a simulation to simulate heat flow in the underhood fluid model from the fluid source to the fluid sink through each of the plural fluid nodes; and while executing the transient thermal model, switching calculations of heat rejected to a fluid flowing through a cooling package node of the plural fluid nodes between rejected heat from a heat source and convected heat from the thermal lumped capacitance according to a modeled state of the vehicle powertrain, wherein switching calculations comprises:

when the vehicle powertrain is modeled in an on state, rejecting heat to the cooling package node from the heat source and forcing heat convection from the thermal lumped capacitance to zero; and when the vehicle powertrain is modeled in an off state, forcing the heat rejected to the cooling package node from the heat source to zero and convecting heat to the cooling package node from the thermal lumped capacitance.

12. The system of claim 11 wherein the plural fluid nodes include-an upstream air node, the cooling package node, and one or more underhood fluid nodes.

13. The system of claim 12, further comprises instructions to cause the one or more processors to:

execute response surface models to provide predictions of air temperature upstream and downstream of the cooling package node, and air mass flow rate passing through the cooling package node; and calculate cooling package heat rejection from the predictions.

14. The system of claim 12 wherein performing a simulation to simulate fluid flow comprises instructions to cause the one or more processors to:

calculate heat rejection; and transfer heat rejection by the cooling package node to at least one of the underhood fluid nodes.

15. The system of claim 14 wherein when the vehicle powertrain is modeled in an off state, the cooling package node convects heat to the at least one underhood fluid node using the thermal lumped capacitance that is initialized with a pre-calculated value.

16. The system of claim 13 wherein the air temperature and the air mass flow rate determine air temperature and mass flow rate coming from the fluid source into the upstream air node.

17. The system of claim 12 wherein the one or more underhood fluid nodes have temperatures calculated through the simulation that are initialized to a certain heat transfer coefficient (HTC) and near wall temperature (NWT), with the near wall temperature being set to an underhood fluid node temperature.

18. The system of claim 11 wherein the vehicle powertrain is mode led in either an on state or in an off state.

19. The system of claim 11 wherein when plural cycles of the vehicle powertrain being in an off state is used in the instructions, the instructions further comprise:

applying plural thermal lumped capacities of different initialization temperatures.

20. A computer program product stored on a non-transitory computer readable medium for modeling heat flow in a vehicle powertrain, the computer program product including computer instructions for causing a system comprising one or more processors and memory to:

receive digital data of a three dimensional representation of the vehicle powertrain including an underhood fluid model including a fluid source and a fluid sink, plural fluid nodes, and a thermal lumped capacitance;

execute a transient thermal model of the vehicle powertrain that includes the underhood fluid model;

wherein execution of the transient thermal model comprises performing a simulation to simulate heat flow in the underhood fluid model from the fluid source to the fluid sink through each of the plural fluid nodes; and while executing the transient thermal model, switching calculations of heat rejected to a fluid flowing through a cooling package node of the plural fluid nodes between rejected heat from a heat source and convected heat from the thermal lumped capacitance according to a modeled state of the vehicle powertrain, wherein switching calculations comprises:

when the vehicle powertrain is modeled in an on state, rejecting heat to the cooling package node from the heat source and forcing heat convection from the thermal lumped capacitance to zero; and when the vehicle powertrain is modeled in an off state, forcing the heat rejected to the cooling package node from the heat source to zero and convecting heat to the cooling package node from the thermal lumped capacitance.

21. The computer program product of claim 20 wherein the plural fluid nodes include an upstream air node, the cooling package node, and one or more underhood fluid nodes, and the computer program product further comprises instructions to cause the one or more processors to:

execute response surface models to provide predictions of air temperature upstream and downstream of the cooling package, and air mass flow rate passing through the cooling package, calculate cooling package heat rejection from the predictions.

* * * * *